(12) United States Patent
Greenwood

(10) Patent No.: US 11,250,969 B2
(45) Date of Patent: Feb. 15, 2022

(54) TUBULAR ALL-WIRE WEFT-KNIT MESH SLEEVE WITH IMPROVED ELECTRICAL CONTINUITY

(71) Applicant: ACS Industries, Inc., Lincoln, RI (US)

(72) Inventor: George Greenwood, Tiverton, RI (US)

(73) Assignee: ACS Industries, Inc., Lincoln, RI (US)

( * ) Notice: Subject to any disclaimer, the term of this patent is extended or adjusted under 35 U.S.C. 154(b) by 876 days.

(21) Appl. No.: 16/013,788

(22) Filed: Jun. 20, 2018

(65) Prior Publication Data

US 2018/0374603 A1 Dec. 27, 2018

Related U.S. Application Data

(60) Provisional application No. 62/523,006, filed on Jun. 21, 2017.

(51) Int. Cl.
| | |
|---|---|
| *D04B 1/22* | (2006.01) |
| *H01B 1/02* | (2006.01) |
| *H05K 9/00* | (2006.01) |
| *H01B 5/12* | (2006.01) |
| *D04B 21/20* | (2006.01) |

(52) U.S. Cl.
CPC ............... *H01B 5/12* (2013.01); *D04B 1/225* (2013.01); *D04B 21/205* (2013.01); *H01B 1/026* (2013.01); *H05K 9/009* (2013.01); *H05K 9/0015* (2013.01); *H05K 9/0098* (2013.01); *D10B 2101/20* (2013.01); *D10B 2401/16* (2013.01)

(58) Field of Classification Search
CPC ........ H01B 5/12; H01B 1/026; D04B 21/205; D04B 21/14; H05K 9/0015; H05K 9/0098; H05K 9/009
See application file for complete search history.

(56) References Cited

U.S. PATENT DOCUMENTS

| | | |
|---|---|---|
| 2,882,082 A | 4/1959 | Poltorak et al. |
| 4,784,886 A | 11/1988 | Monget et al. |
| (Continued) | | |

FOREIGN PATENT DOCUMENTS

| | | |
|---|---|---|
| GB | 2222912 A | 3/1990 |
| JP | 1140973 A | 2/1999 |
| (Continued) | | |

OTHER PUBLICATIONS

Special Metals—"MONEL alloy 400", Publication No. SMC-053, Special Metals Corporation, 2005 (Feb. 2005) https://222.google.com/url?sa-t&rct-j&q-&esrc-S&source-web&cd-1&ved-OahUKEwiCxdKk7vPYAhalloy-400.pdf&usg=AOvVaw2Zrophjy8Q8NONfJETZIBq.

(Continued)

*Primary Examiner* — Jenna L Johnson
(74) *Attorney, Agent, or Firm* — Barlow, Josephs & Holmes, Ltd.; Stephen J. Holmes

(57) ABSTRACT

An all-wire weft-knit tubular sleeve can be knit from a plurality of electrically conductive wire filaments. Further, an electrically conductive bus wire can be interlaced in the weft knit pattern of the tubular sleeve to provide improved electrical contact along the entire length of the gasket. The exemplary weft-knit sleeve can allow for at least a 15% axial stretch without breaking the bus wire. The conductive wire filaments can be a copper/nickel alloy having a wire diameter of between about 0.075 mm and about 0.1 mm, a tensile strength of between about 70-125 KSI and an elongation of at least 12%.

10 Claims, 4 Drawing Sheets

(56) References Cited

U.S. PATENT DOCUMENTS

| | | | |
|---|---|---|---|
| 4,838,043 A | 6/1989 | Jencks | |
| 5,294,270 A | 3/1994 | Fenical | |
| 5,512,709 A | 4/1996 | Jencks et al. | |
| 5,581,048 A | 12/1996 | Shores | |
| 5,603,514 A | 2/1997 | Jencks et al. | |
| 6,219,906 B1 | 4/2001 | Sosnowski | |
| 6,854,298 B2 | 2/2005 | Relats et al. | |
| 7,248,756 B2 | 7/2007 | Ebbesen et al. | |
| 2002/0195260 A1* | 12/2002 | Marks | D04C 1/06 174/351 |
| 2007/0243356 A1 | 10/2007 | Baer et al. | |
| 2007/0275199 A1 | 11/2007 | Chen | |
| 2008/0135119 A1 | 6/2008 | Tonooka et al. | |
| 2013/0068518 A1 | 3/2013 | Kato et al. | |
| 2014/0251651 A1 | 9/2014 | Huang et al. | |

FOREIGN PATENT DOCUMENTS

| | | |
|---|---|---|
| WO | 9746817 A1 | 12/1997 |
| WO | 03001566 A2 | 1/2003 |

OTHER PUBLICATIONS

MuMETAL - Magnetic Shield Corp. - "MuMETAL Technical Data" 2015.

Holland Shielding Technical Datasheet—"1200 Metal knit EMI/RFI gasket" https://hollandshielding.com/Metal-knit-EMI-RFI-gasket.

* cited by examiner

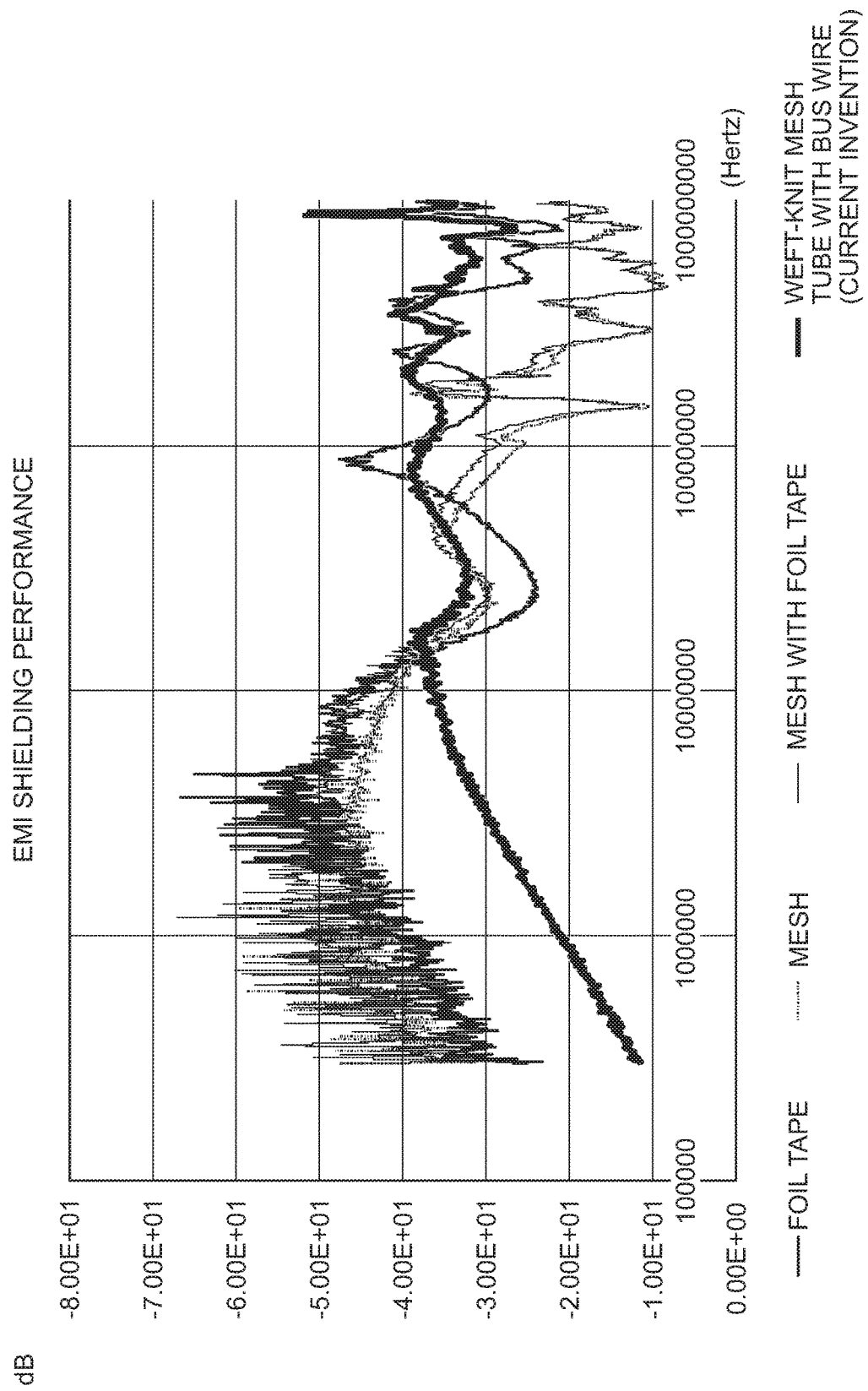

TUBULAR ALL-WIRE WEFT-KNIT MESH SLEEVE WITH IMPROVED ELECTRICAL CONTINUITY

CROSS-REFERENCE TO RELATED APPLICATIONS

This application is related to and claims benefit of U.S. Provisional Application No. 62/523,006 filed Jun. 21, 2017, hereby incorporated by reference in its entirety.

TECHNICAL FIELD

The instant invention generally relates to wire mesh EMI shielding products, and more particularly to a novel all-wire weft-knit tubular sleeve having improved electrical continuity.

BACKGROUND OF THE INVENTION

Mesh gaskets, or sleeves, are used in a variety of electronic systems and products. Prior art mesh gaskets suffer from poor electrical continuity, or reliability, as connections between the filaments can become disconnected in both tension and compression, thereby breaking a continuous electrical connection down the length of a sleeve. Moreover, prior art sleeves suffer from limited mechanical properties, including tensile strength or compression, before breakage.

Therefore, there is a need for improved mesh tubular sleeves having improved electrical continuity in a variety of configurations with improved mechanical properties.

SUMMARY OF THE INVENTION

The present disclosure provides an improved shielding gasket or sleeve which exhibits good compression into a flattened ribbon shape and at the same time improved end-to-end conductivity for shielding. The present all-wire shielding gasket may be weft-knit as a tubular sleeve from a plurality of electrically conductive wire filaments. Advantageously, an electrically conductive bus wire can be interlaced in the weft knit pattern to form the tubular sleeve to provide improved electrical contact along the entire length of the gasket. In one exemplary embodiment, the bus wire can be knitted directly into weft-knit pattern of the sleeve. For example, the bus wire can have a stitch pattern of skipping two loops axially and one loop radially forming a repeating zig-zag pattern while the sleeve is being knitted, or after the sleeve is knitted into a tube. In another embodiment, the bus wire can be stitched in a zig-zag pattern into the tubular sleeve after it is flattened. In some embodiments, one or more bus wires can be stitched into the sleeve. In still other embodiments, the bus wire can be welded in a zig-zag pattern on the surface of the tubular sleeve after its flattened. All of the embodiments can allow for at least a 15% axial stretch of the sleeve without breaking the bus wire. In one exemplary embodiment, the conductive wire filaments can be a copper/nickel alloy having a wire diameter of between about 0.075 mm and about 0.1 mm, a tensile strength of between about 70-125 KSI and an elongation of at least 12%. Additionally, each bus wire can comprise a bundle of two or more (preferably three) parallel bus wire filaments (2 or more wire filaments bundled together). Each wire can be a copper/nickel alloy having a wire diameter of between about 0.075 mm and about 0.1 mm, a tensile strength of between about 70-125 KSI and an elongation of at least 12%.

BRIEF DESCRIPTION OF THE DRAWINGS

While the specification concludes with claims particularly pointing out and distinctly claiming particular embodiments of the instant invention, various embodiments of the invention can be more readily understood and appreciated from the following descriptions of various embodiments of the invention when read in conjunction with the accompanying drawings in which:

FIG. 4 is a graph showing the performance of a preferred embodiment of the weft-knit sleeve of FIG. 2 as compared to prior art shielding materials.

DETAILED DESCRIPTION OF THE INVENTION

Figure 1:
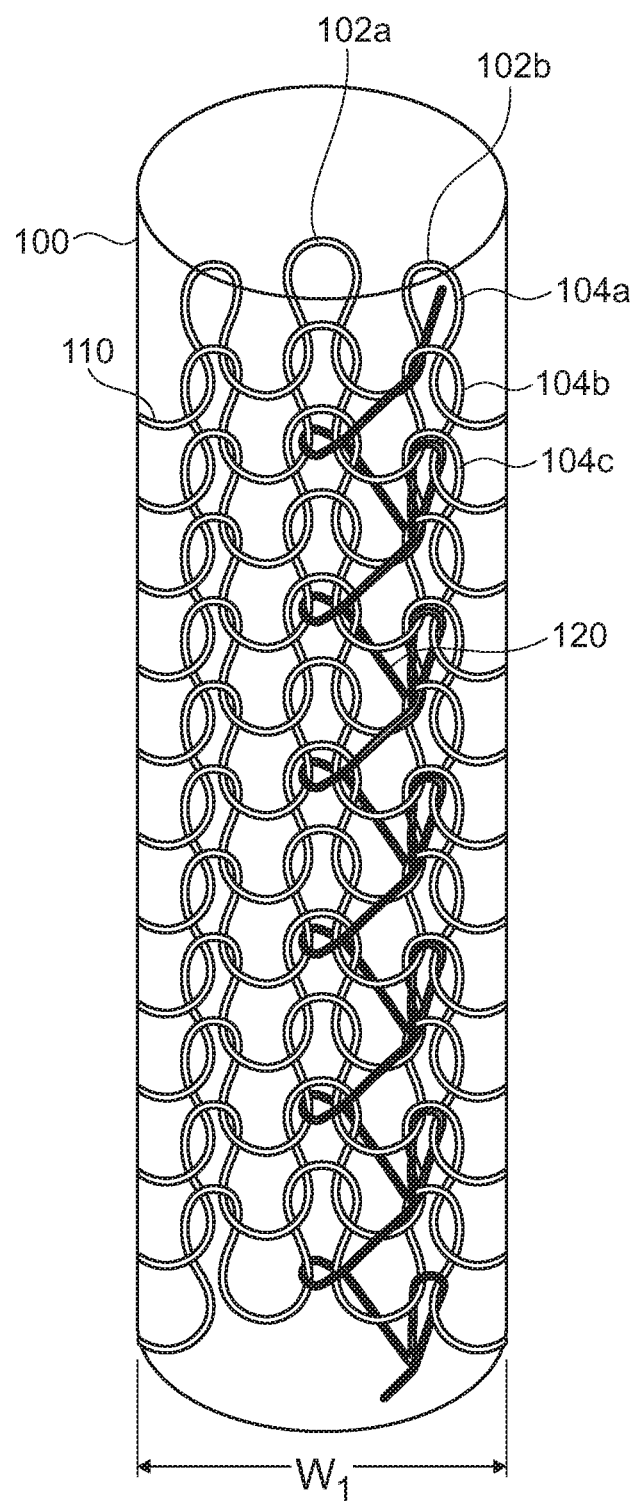
FIG. 1 is a schematic illustration of the weft-knit stitching pattern of a first exemplary embodiment incorporating a bus wire into the weft-knit pattern.
Figure 2:
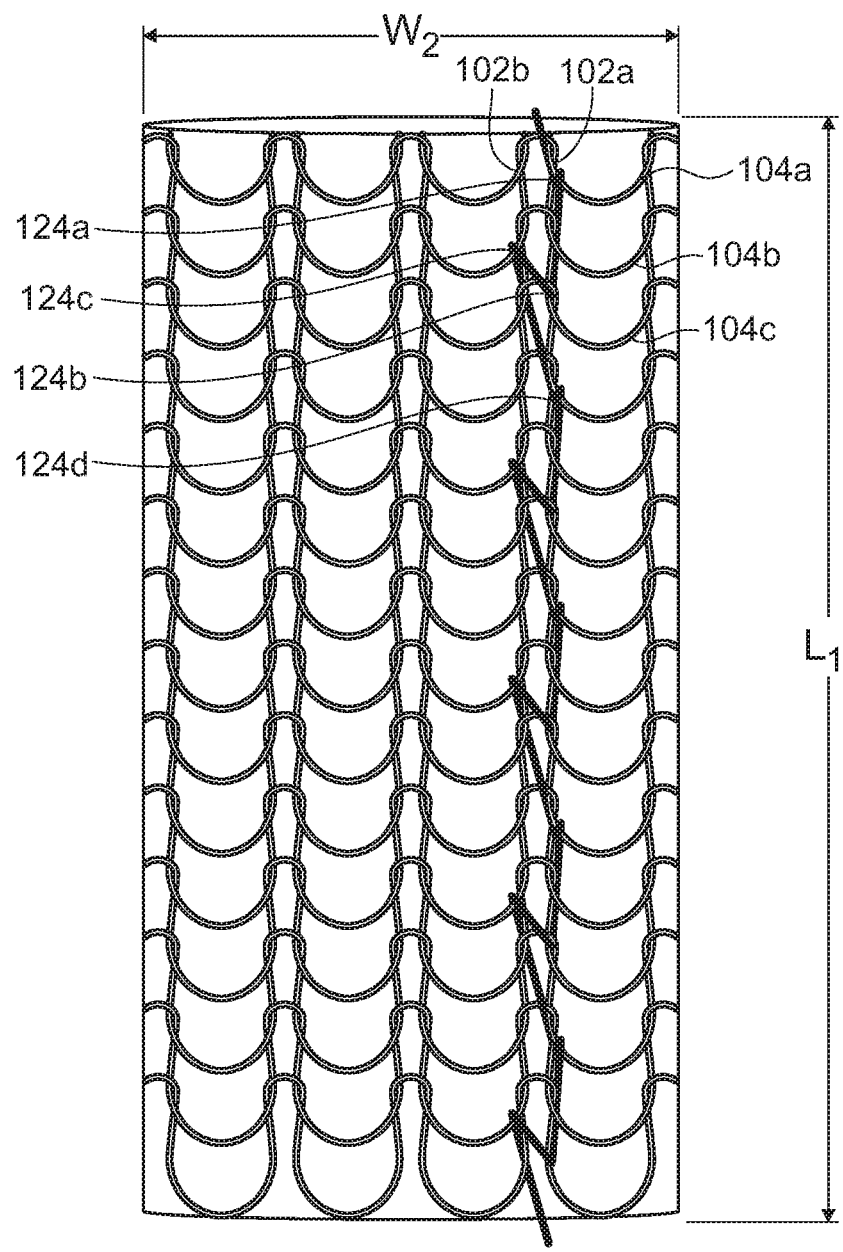
FIG. 2 is a schematic illustration of the weft-knit stitching pattern after knitting and flattening.
Figure 3:
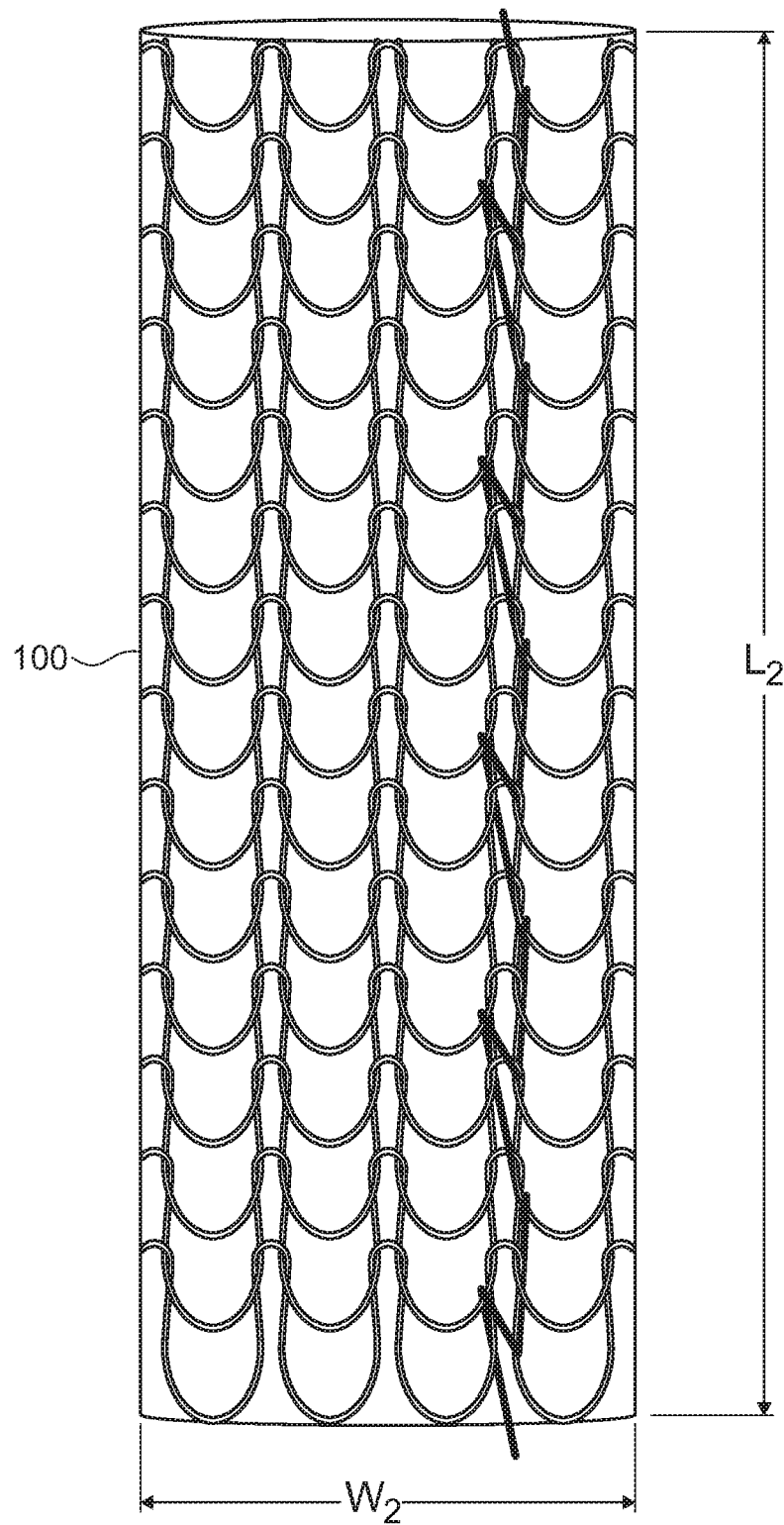
FIG. 3 is a schematic illustration of the weft-knit tube stretched a distance $\Delta L$.

Referring now to the drawings, a first exemplary embodiment of the present sleeve, or gasket, is shown and described in detail in FIGS. 1-3.

An all-wire gasket sleeve 100 is knit as a tubular sleeve from a plurality of electrically conductive wire filaments 110. In some embodiments, the all-wire tubular sleeve gasket 100 may be used as an EMI shielding gasket.

Knitted materials, in general, can have a single, or a plurality, of electrically conductive wires, or filaments, that follow a meandering path, or a course, to form symmetric rows of loops above and below a mean path of the wire. The sequence of stitches in which each stitch is suspended from the next is commonly referred to as a wale shown in rows 104a, 104b, 104c. In a weft-knit pattern, the entire fabric can be produced from a single strand of yarn 110, or a plurality of strands, by adding stitches to each wale in turn, moving across the fabric as in a raster scan. Alternatively, the sleeve can be stitched or knitted with a warp knit pattern. The sleeve 100 can be knitted be hand or machine. In one embodiment, the weft-knit sleeve 100 can be knitted on a single feed, 8 needle (8 N) knitting machine. In one embodiment, the sleeve 110 can be manufactured with a machine having a needle count of 48 N to 70 N. Preferably the tube, or sleeve, 100 can have a diameter between about 6 mm to about 24 mm. In one embodiment, the tube 100 can have a diameter of approximately 15 mm and a 24 mm flattened width. In some embodiments, the tube 100 can have approximately 10-12 opening per 25 mm of knitted length. Other configurations are also contemplated.

For example, in an exemplary embodiment a tube 100, having a 15 mm diameter ($W_1$) and 24 mm flattened width ($W_2$), a needle count of at least 48 N can be used to create a mesh with 1 mm openings. In an alternative embodiment, a 70 N head can create a tube 100 having a 15 mm diameter $W_1$ with a flattened width of 24 mm $W_2$, with a 0.68 mm opening. The tube 100 can be knitted into a continuous length of stock which can be flattened down to have a larger width $W_2$ than the width $W_1$ when the sleeve is in a tube form. When flattened, the tube 100 can be stretched radially, to create the larger width $W_2$. In one embodiment, the flattened tubular sleeve 100 can have a width $W_2$ of approximately 10 mm to 15 mm, or larger. In some embodiments, the tube 100 can be continuously knitted, flattened, and have the bus wire 120 attached thereto as described below. As the tube 100 is being made, it can then be spooled up for future use. For example, desired lengths of the flattened tube 100 with the bus wire 120 can be cut from the spool as needed.

In the exemplary embodiment, the tube 100 can be knitted using conductive wire filaments 110 which can be a copper/nickel alloy having a wire diameter of between about 0.075 mm and about 0.1 mm, a tensile strength of between about 70-125 KSI and an elongation of at least 12%. In one preferred embodiment, the alloy is a 30% copper 70% nickel alloy, such as MONEL™ (MONEL is a trademark of Special Metals Corp). Other possible materials include 430 stainless steel conductive filaments or other nickel-based alloys, such as MUMETAL™ (MUMETAL is a trademark of Magentic Shield Corporation)

Still referring to FIGS. 1 and 2, as noted above, at least one electrically conductive bus wire 120 is interlaced, woven, or stitched into the weft knit pattern of the tubular sleeve 100 to provide improved electrical contact along the entire length L of the sleeve 100. In an exemplary embodiment, the bus wire 120 can be knitted into the weft-knit pattern, skipping two loops axially, 104a, 104b, and one loop circumferentially 102a, forming a repeating zig-zag pattern. The length of the bus wire 120 used in a length of a stitch is larger than the length of the stitch itself. In other words, a longer length of bus wire is used to create a single stitch than the stitch is long. As shown in at least FIG. 2, a stitch 122 of the bus wire, or wires, can extend down from a first location 124a two rows axially, from a first row 104a, through a second row 104b to a third row 104c, to a second location 124b. The stitch 122 can continue laterally from the first column 102a to a second column 102b circumferentially and one row axially upward from the third row 104c to the second row upward to a third location 124c. From the third location 124c, the stitch 122 can continue three rows axially and laterally back one column to a fourth location 124d. This pattern can then continue the length of the tubular sleeve 100.

The bus wire 120, in a preferred embodiment, can include three parallel bus wire filaments each comprising a 30% copper/70% nickel alloy (MONEL™) having a wire diameter of between about 0.075 mm and about 0.1 mm, a tensile strength of between about 70-125 KSI and an elongation of at least 12%. The three parallel bus wire filaments can be bundled together as a single bus wire 120 to provide added width and surface contact area between the tube wires 100 and the bus wire 120 for improved electrical conductivity along the entire length of the sleeve 100. In other embodiments, the bus wire 120 may comprise a single wire filament, or two or more bundled wire filaments. In effect, the bus wire 120 can extend the full length of the tube 100 ensuring the electrical conductivity between the wales, in the case that the knitted wire 110 which makes up the wales breaks. Due to the zig-zag pattern, the particular stitching of the bus wire 120 permits for the sleeve 100 to be stretched axially a minimum of 15% without the bus wire 120 breaking or unwinding from the sleeve 100. Alternative zig-zag patterns are contemplated to be within the scope of the disclosure.

In another embodiment, the bus wire 120 can be stitched lengthwise in the zig-zag pattern into the tubular, all-wire weft-knit sleeve 100 after the tubular sleeve has been flattened. This exemplary embodiment has a flattened width $W_2$ of about 10 mm to about 15 mm. Other sizes and configurations are contemplated. Still referring to FIG. 2, in an alternative embodiment, the bus wire 120 can be welded, in addition or instead of stitched, in a zig-zag pattern on the surface of the tubular sleeve 100 after its flattened. When completed, all embodiments of the knitted gaskets 100 allow for at least a 15% axial stretch without breaking the bus wire 120, from a first length $L_1$ to a second length $L_2$, as shown in FIGS. 2 and 3.

In another alternative embodiment, two or more parallel bus wires 120 (each comprising 3 filaments) can be knitted into, stitched into, or welded onto the tubular sleeve 100 before or after the sleeve is flattened. The specific circumferential location of the bus wire 120 in the gasket is not critical to functionality. Other knitting methods, such as circular warp knitting are also contemplated for forming the sleeve.

Turning to FIG. 4, it can be seen that the instant gasket 100 provided enhanced performance when compared to prior art shielding materials (foil tape, traditional mesh, and traditional mesh with foil tape). In testing, a conductive wire was coaxially shielded with a FOIL TAPE, a MESH SLEEVE, a MESH SLEEVE with FOIL TAPE and the present WEFT-KNIT MESH WITH BUS WIRE. FIG. 4 graphs the performance of these materials with absorption in dB on the y-axis version frequency in Hertz (Hz) on the x-axis. The present gasket 100 (weft-knit mesh tube with bus wire) showed superior shielding performance between about 500 KHz and about 30 MHz which is a desirable operating range for many electronic applications.

It can therefore be seen that the exemplary embodiments provide a novel and inventive electromagnetic shielding gasket with improved conductivity and shielding effect. In some exemplary embodiments, the tubular sleeve can have a plurality of uses. For example, the sleeve can be used in place of prior-art EMI shielding gaskets to provide enhanced electrical continuity along the length of the gasket. Alternative uses can include placement on surfaces to use the gasket 100 as a proximity sensor.

While there is shown and described herein certain specific structures embodying various embodiments of the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed is:

1. An all-wire gasket sleeve comprising:
 a weft-knit tubular sleeve knit from a plurality of electrically conductive wire filaments; and
 an electrically conductive bus wire interlaced in the weft knit pattern of said tubular sleeve,
 wherein the tubular sleeve is flattened and the bus wire is affixed to the flattened sleeve in a zig-zag pattern allowing the bus wire and the weft-knit tubular sleeve to stretch axially 15% from its relaxed state without breaking the bus wire, and
 wherein the electrically conductive bus wire is interlaced into said tubular sleeve with a different pattern than the weft knit pattern.

2. The all-wire gasket sleeve of claim 1 wherein the bus wire is knitted into the weft-knit pattern skipping two loops axially and one loop radially forming a repeating zig-zag pattern.

3. The all-wire gasket sleeve of claim 1 wherein the bus wire is stitched through the flattened sleeve in a zig-zag pattern allowing the bus wire to stretch axially 15% from its relaxed state.

4. The all-wire gasket sleeve of claim 1 wherein the bus wire is welded to the flattened sleeve in a zig-zag pattern allowing the bus wire to stretch axially 15% from its relaxed state.

5. The all-wire gasket sleeve of claim 1 wherein,
said conductive wire filaments having a wire diameter of between about 0.075 mm and about 0.1 mm, a tensile strength of between about 70-125 KSI and an elongation of at least 12%.

6. The all-wire gasket sleeve of claim 1 wherein,
said bus wire comprises three parallel bus wire filaments each comprising a wire filament having a wire diameter of between about 0.075 mm and about 0.1 mm, a tensile strength of between about 70-125 KSI and an elongation of at least 12%.

7. The all-wire gasket sleeve of claim 5 wherein,
said bus wire comprises three parallel bus wire filaments each comprising a wire filament having a wire diameter of between about 0.075 mm and about 0.1 mm, a tensile strength of between about 70-125 KSI and an elongation of at least 12%.

8. The all-wire gasket sleeve of claim 1 wherein each of said electrically conductive wire filaments comprises an alloy of 30% copper and 70% nickel.

9. The all-wire gasket sleeve of claim 1 wherein,
said bus wire comprises two or more parallel bus wire filaments each comprising a wire filament having a wire diameter of between about 0.075 mm and about 0.1 mm, a tensile strength of between about 70-125 KSI and an elongation of at least 12%.

10. The all-wire gasket sleeve of claim 9 wherein each of said electrically conductive wire filaments comprises an alloy of 30% copper and 70% nickel.

* * * * *